(12) United States Patent
Yu et al.

(10) Patent No.: US 11,614,483 B2
(45) Date of Patent: Mar. 28, 2023

(54) TEST APPARATUS FOR TESTING SEMICONDUCTOR PACKAGES AND AUTOMATIC TEST EQUIPMENT HAVING THE SAME

(71) Applicant: Samsung Electronics Co., Ltd., Suwon-si (KR)

(72) Inventors: Dahm Yu, Anyang-si (KR); Hyunmin Kwon, Jeonju-si (KR); Jaehyun Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 17/152,474

(22) Filed: Jan. 19, 2021

(65) Prior Publication Data

US 2021/0325450 A1 Oct. 21, 2021

(30) Foreign Application Priority Data

Apr. 17, 2020 (KR) ........................ 10-2020-0046771

(51) Int. Cl.
*G01R 31/26* (2020.01)
*G01R 31/28* (2006.01)
*G01R 1/04* (2006.01)
*G01R 1/067* (2006.01)
*G01R 1/073* (2006.01)

(52) U.S. Cl.
CPC ....... *G01R 31/2863* (2013.01); *G01R 1/0433* (2013.01); *G01R 31/2886* (2013.01)

(58) Field of Classification Search
CPC ........ G01R 31/02; G01R 31/26; G01R 31/28; G01R 1/04; G01R 1/067; G01R 1/073
See application file for complete search history.

(56) References Cited

U.S. PATENT DOCUMENTS

| | | | |
|---|---|---|---|
| 6,445,203 B1 | 9/2002 | Yamashita et al. | |
| 6,972,557 B2 | 12/2005 | Park | |
| 7,242,207 B2 | 7/2007 | Park | |
| 10,466,273 B1 | 11/2019 | Hwang et al. | |
| 11,061,069 B2* | 7/2021 | Gopal | G01R 1/0458 |
| 2006/0066293 A1* | 3/2006 | Gopal | G11C 29/56016 324/750.14 |
| 2008/0090429 A1* | 4/2008 | Mok | G01R 1/06755 205/255 |
| 2016/0091559 A1* | 3/2016 | Teoh | G01R 31/2875 324/750.05 |

FOREIGN PATENT DOCUMENTS

| | | |
|---|---|---|
| KR | 10-0542126 B1 | 1/2006 |
| KR | 10-1074288 B1 | 10/2011 |
| KR | 10-2016-0007138 A | 1/2016 |
| KR | 10-1632994 B1 | 7/2016 |
| KR | 10-1926387 B1 | 12/2018 |
| KR | 10-2019-0048414 A | 5/2019 |

* cited by examiner

*Primary Examiner* — Neel D Shah
(74) *Attorney, Agent, or Firm* — Muir Patent Law, PLLC

(57) ABSTRACT

A test apparatus and an automatic test equipment having the same are disclosed. The test apparatus includes a test head having a test area, a socket board combined to the test area of the test, the socket board including a socket body and an active device attached on a first surface of the socket body, the active device configured to operate a semiconductor package, and a heat exchanger arranged on an upper portion of the test head, the heat exchanger being in contact with the socket board.

18 Claims, 12 Drawing Sheets

TEST APPARATUS FOR TESTING SEMICONDUCTOR PACKAGES AND AUTOMATIC TEST EQUIPMENT HAVING THE SAME

CROSS-REFERENCE TO RELATED APPLICATIONS

This application claims priority under 35 U.S.C. § 119 to Korean Patent Application No. 10-2020-0046771 filed on Apr. 17, 2020 in the Korean Intellectual Property Office, the contents of which are incorporated by reference herein in their entirety.

BACKGROUND

1. Field

Example embodiments relate to a test apparatus for testing semiconductor packages and an automatic test equipment having the same, and more specifically, to a test apparatus for conducting thermal operation test and a cold operation test to semiconductor packages and an automatic test equipment (ATE) having the same.

2. Description of the Related Art

When completing a manufacturing process of semiconductor packages, a reliability test is generally conducted to the semiconductor packages including electric operation tests by using an automatic test equipment (ATE).

For example, reading and writing functions of each memory cell and interferences between neighboring cells may be tested by the reliability test. A test pattern is generated from a pattern generator and is applied to a package under test (PUT). Then, an output signal pattern coming from the PUT is detected and is compared with a reference signal pattern. Fail or non-fail/pass of the PUT is determined by a comparison result of the output signal pattern and the reference signal pattern.

In conventional ATEs, temperature gradients may occur between an ambient temperature of the ATE and a surface temperature of the PUT. Thus, it is difficult to set the PUT to a test temperature in the ATE. For example, the ambient temperature may affect the surface temperature of the PUT.

The PUTs are secured onto an upper portion of a socket board and the socket board is enclosed by a test chamber in such a way that the PUTs are exposed to a test space of the test chamber. A bottom of the socket board is combined to the base board that is exposed to the atmospheric pressure and temperature in the ATE. Thus, the test space of the test chamber is set to a test temperature and the bottom of the socket board is set to the ambient temperature (e.g., a room temperature), which necessarily causes the temperature gradient between the upper portion of the PUT exposed to the test space and the lower portion of the PUT affected by the atmospheric pressure and/or temperature.

Thus, although the test temperature is controlled uniformly in the test space of the test chamber, the PUTs are difficult to be uniformly set to the test temperature due to the temperature gradient of the PUT.

In certain cases, a plurality of active devices for operating the PUTs is arranged at the bottom of the socket board. In these cases, operation heats of the active devices necessarily increase the surface temperature of the bottom of the socket board, which significantly increases the temperature gradient in a cold test to the PUT.

Accordingly, even though a uniform test temperature is set in the test chamber, it can hardly result in getting a uniform test temperature of the PUT in an electric operation test, and thus the reliability of the electric operation test tends to reduce due to the temperature gradient of the PUT.

SUMMARY

Example embodiments of the present inventive concept provide a test apparatus for testing semiconductor packages in which a lower temperature of the PUT is controlled at a bottom portion as well as at an upper portion of the PUT, to thereby improve the uniformity of the test temperature of the PUT.

Other example embodiments of the present inventive concept provide an automatic test equipment (ATE) having the above test apparatus.

According to exemplary embodiments of the inventive concept, there is provided a test apparatus including a test head having a test area, a socket board combined to the test area of the test, the socket board including a socket body and an active device attached on a first surface of the socket body, the active device configured to operate a semiconductor package, and a heat exchanger arranged on an upper portion of the test head, the heat exchanger being in contact with the socket board.

According to other exemplary embodiments of the inventive concept, there is provided an automatic test equipment including a socket board configured that a semiconductor package is secured on the socket board, a heat exchanger making contact with the socket board, a test chamber configured to provide a test space isolated from outside while the semiconductor package is tested in the test chamber, and a pusher arranged in the test chamber and configured to push the semiconductor package in a test tray towards the socket board.

According to example embodiments of the present inventive concept, the heat exchanger buried on the upper portion of the base board may make contact with the socket board onto which at least a PUT may be secured. Thus, a lower portion of the PUT may be set to the test temperature of the operation test just by heat exchange between the socket board and the heat exchanger. An upper portion of the PUT may also be uniformly set to the test temperature of the operation test by test fluid in the test chamber. Thus, the operation test may be conducted to the PUT under the uniform test temperature, to thereby improve the accuracy and reliability of the operation test in the ATE.

Particularly, since operation heats generated from PUTs and active devices of the socket board may be sufficiently dissipated into the heat exchanger, a cold test temperature may be accurately maintained in a cold test in spite of the operation heats of the PUTs and the active devices, to thereby increase accuracy of the cold test in the ATE.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
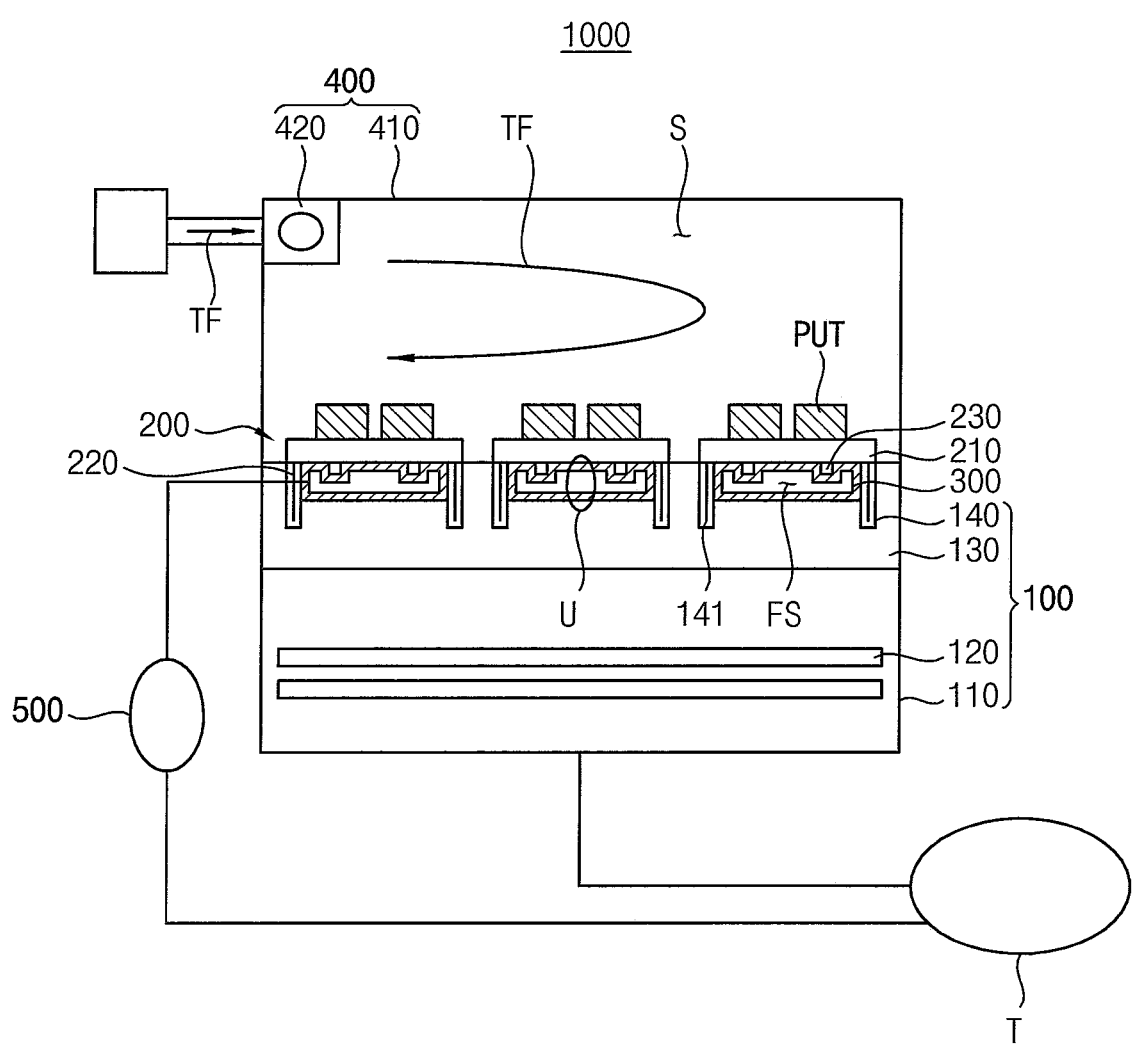
FIG. 1 is a structural view illustrating a test apparatus for testing semiconductor packages in accordance with an example embodiment of the present inventive concept.

Reference will now be made to example embodiments, which are illustrated in the accompanying drawings, wherein like reference numerals may refer to like components throughout.

Figure 2:
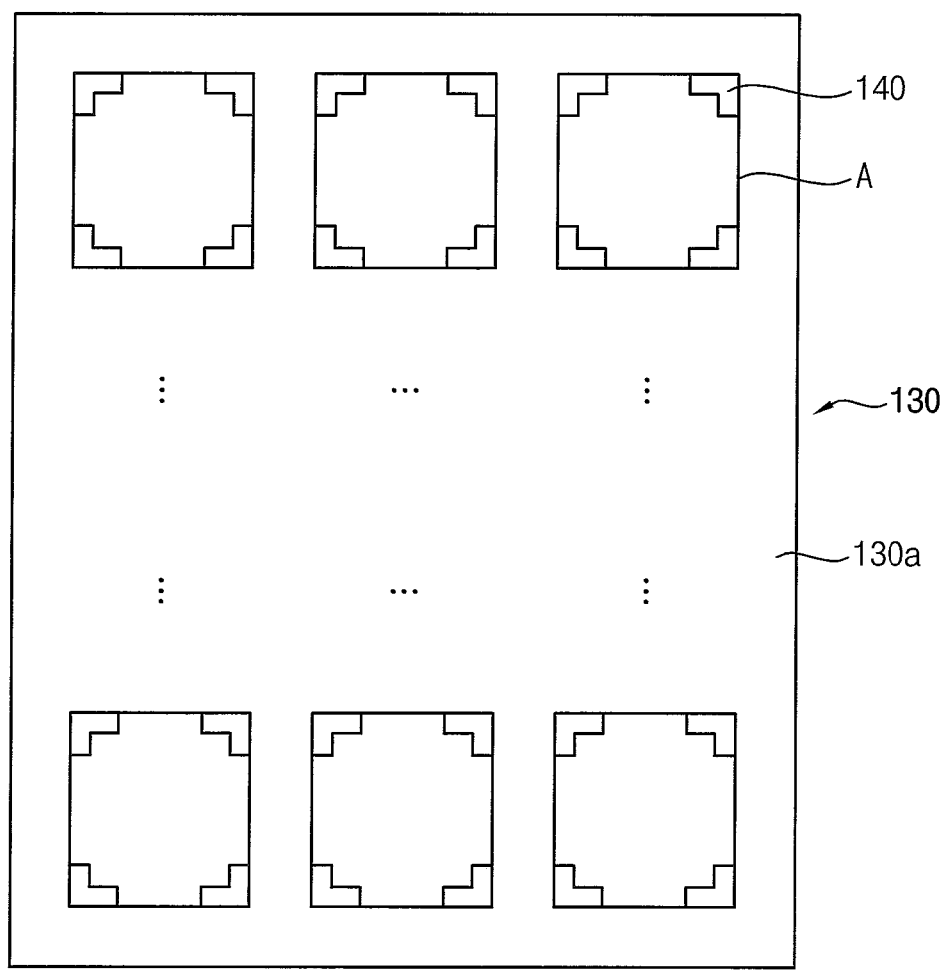
FIG. 2 is a plan view illustrating a base board of a test head shown in FIG. 1.

FIG. 1 is a structural view illustrating a test apparatus for testing semiconductor packages in accordance with an example embodiment of the present inventive concept and FIG. 2 is a plan view illustrating a base board of a test head shown in FIG. 1.

Referring to FIGS. 1 and 2, a test apparatus 1000 for testing semiconductor packages in accordance with an example embodiment of the present inventive concept may include a test head 100 having a plurality of test areas A at each of which a semiconductor package under test (PUT) is located, e.g., during an operation test of the semiconductor packages. The test apparatus 1000 may conduct an operation test to a plurality of PUTs under a test temperature. A plurality of socket boards 200 may be respectively combined to the plurality of test areas A of the test head 100 in such a configuration that a PUT may be arranged on an upper portion of each of the socket boards 200, and one or more active devices 230 may be provided on a rear portion of each of the socket boards 200. A heat exchanger 300 may be buried in an upper portion of the test head 100 and may make contact with the socket boards 200 in such a configuration that a heat exchange may be conducted with the socket boards 200 until the PUTs may be set to the test temperature. For example, the heat exchanger 300 may be interposed between the test head 100 and the socket boards 200. A test chamber 400 may be combined to the test head 100 to provide a test space S enclosing the PUTs and separated from surroundings. A temperature control center 500 may be provided to control the heat exchanger 300 to set the socket boards at the test temperature.

Spatially relative terms, such as "beneath," "below," "lower," "above," "upper," "rear," "top," "bottom" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

For example, the test head 100 may include various signal processors for conducting the operation test to the PUTS in the test apparatus 1000.

In the present example embodiment, the test head 100 may include a head chamber 110, at least a test channel 120 arranged in the head chamber 110, a base board 130 shaped into a plate and electrically connected to the test channel 120 and a plurality of base connectors 140 arranged in the base board 130 around each of the test areas A.

The head chamber 110 may be shaped into a 3-dimensional structure having a sufficient strength and rigidity and may have an inner space in which the test channel 120 may be received.

The test channel 120 may include or may be a board structure (e.g., a board) in which the signal processors are mounted on a circuit board such as a printed circuit board (PCB). For example, the test channel 120 may be a circuit board including semiconductor chips mounted on the circuit board. A test signal may be generated in a test center T which may be arranged in an exterior of the test head 100, and may be received in the test channel 120. For example, the test signal generated from the test center T may be sent to the test channel 120. Then, the test channel 120 may transfer the test signal to each of the PUTs and operation signals of each PUT may be detected/received by the test channel 120. Thereafter, the operation signals of the PUTs may be transferred to the test center T by the test channel 120.

The base board 130 may be combined to an upper portion of the head chamber 110 in such a configuration that the inner space of the head chamber 110 may be covered by the base board 130 and the inner space of the head chamber 110 may be formed into a closed space that may be sealed and/or separated from surroundings. For example, an upper surface 130a of the base board 130 may be exposed toward the test space S. Thus, the test channel 120 may be arranged in the closed inner space of the head chamber 110 and be protected from external disturbances.

For example, the base board 130 may include or may be an adiabatic plate that may comprise a polymer such as a fiberglass and/or poly vinyl chloride (PVC), and a plurality of electric circuit patterns (not shown) may be printed in the base board 130. The electric circuit pattern may be electrically connected to the test channel 120 that may be arranged under the base board 130.

The base board 130 may be divided into various sections corresponding to a plurality of test areas A to which the socket boards 200 may be combined respectively, and each of the test areas A may be defined by some of the base connectors 140 that may be inserted into/formed in the base board 130 from the upper surface 130a of the base board 130.

In the present example embodiment, the base board 130 may have a sufficient thickness to hold the heat exchanger 300 therein, so that the heat exchanger 300 may be arranged in the base board 130 without any interference with the circuit patterns formed in the base board 130.

The base connectors 140 may be arranged at an edge portion of the test area A to define the teste area A and may be connected to a socket connector 220 that may be arranged at a peripheral portion of each socket board 200.

For example, a connection groove/hole may be arranged on the upper surface 130a of the base board 130, and the base connector 140 may include a contact terminal 141 that may be arranged in the connection groove/hole. For example, the contact terminal 141 of the base connector 140 may be disposed at the bottom of the hole formed in the base board 130. The contact terminal 141 may be electrically connected to the circuit patterns in the base board 130.

In the present example embodiment, the test area A may be shaped into a square and a plurality of test areas A may be arranged on the upper surface 130a of the base board 130 in a matrix shape. In such a case, the base connector 140 may be arranged at each corner of the square shaped test area A, e.g., in a plan view. Thus, four base connectors 140 may be arranged at the corner positions of each test area A, and as a result, the socket board 200 may be connected to the base board 130 at four positions. The shape of the test area A and the configurations of the base connector 140 may vary according to the configurations of the socket board 200.

In the present example embodiment, the test head 100 may be provided as an option board structure (e.g., an option board) that may be changed into a proper test board according to operation tests performed on the PUTs. For example, the test head 100 may be changed into a digital input/output (I/O) board, a parameter measurement unit (PMU), a radio frequency (RF) board, a high speed I/O board and a device power supply (DPS) board. Thus, the configurations of the test head 100 may be easily modified according to the test operations performed on the PUTs.

The socket board 200 may be combined to the test board 130 on the test area A that may be defined by some base connectors 140. The PUT may be inserted into the socket board 200 and the socket board 200 holding at least one PUT may be combined to each of the test areas A of the test board 130. For example, one socket board 200 may hold two or more PUTs. For example, one socket board 200 may be combined to each test area A. The socket board 200 may make contact with the heat exchanger 300, so that the temperature of the socket board 200 may be set to the test temperature by a heat exchange with the heat exchanger 300.

For example, the socket board 200 and the heat exchanger 300 may exchange heat with each other so that the socket board 200 and the heat exchanger 300 reach the same temperature which is the test temperature.

Figure 3A:
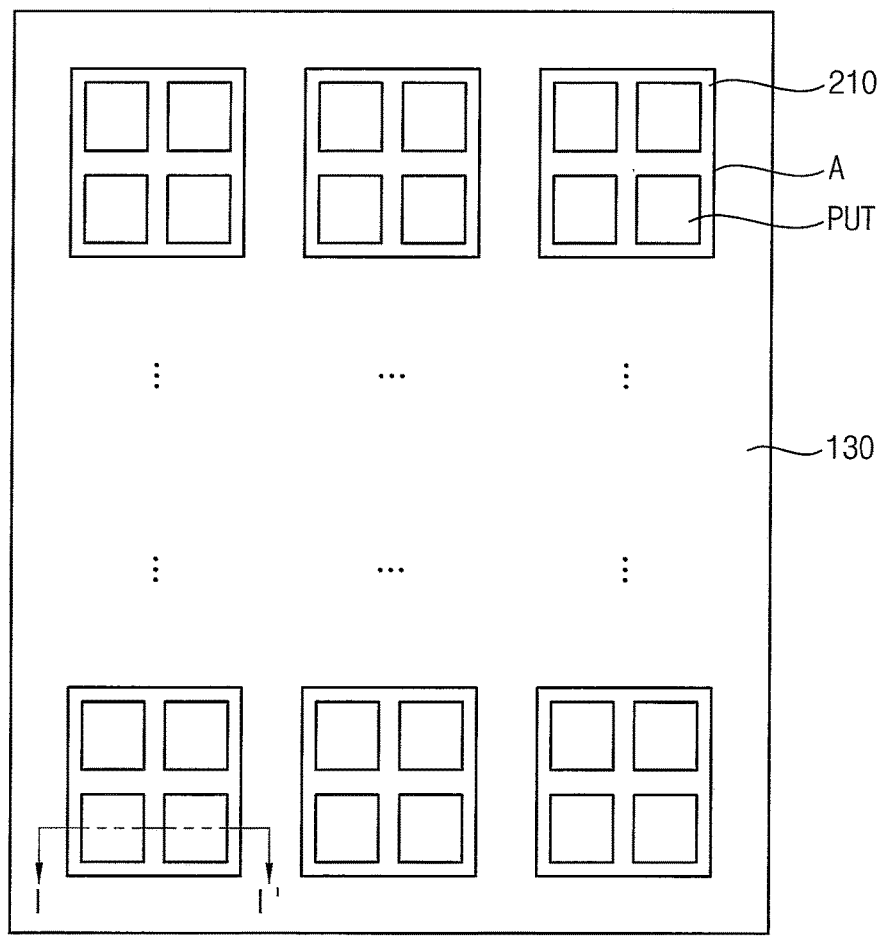
FIG. 3A is a plan view illustrating socket boards combined to the base board shown in FIG. 2.
Figure 3B:
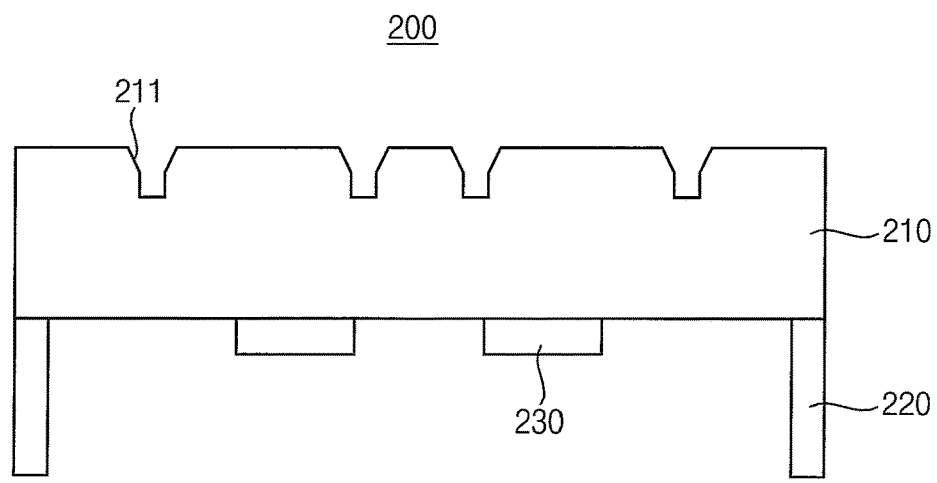
FIG. 3B is a cross sectional view of a socket board taken along a line I-I' in FIG. 3A.

FIG. 3A is a plan view illustrating the socket board combined to the base board shown in FIG. 2 and FIG. 3B is a cross sectional view of the socket board taken along a line I-I' in FIG. 3A.

Referring to FIGS. 3A and 3B, the socket board 200 may include a socket body 210 on which at least one securing member 211 for securing the PUT to the socket board 200 may be arranged, a socket connector 220 extending from a peripheral portion of the socket body 210 and inserted into the connection groove/hole in such a configuration that the socket connector 220 may be in contact with the contact terminal 141 of the base connector 140, and at least one active device 230 arranged on a rear surface/bottom surface of the socket body 210. The active device 230 may generate/emit operation heat when conducting the operation test to the PUT.

The socket body 210 may include or may be a circuit board having the securing member 211 at an upper surface thereof. For example, various circuit patterns (not shown) may be printed in the socket body 210 and the circuit patterns may be electrically connected to the securing member 211. For example, the securing member 211 may include a recess/trench recessed from the upper surface of the socket body 210 or a protrusion/bump protruded from the upper surface of the socket body 210. A joint portion (not shown) of the PUT may be combined to the securing member 211 of the socket body 210, so that the PUT may be secured to the corresponding socket body 210. For example, the PUT may be electrically connected to the socket body 210 via the electrical connection of the joint portion of the PUT and the circuit patterns of the socket body 210.

The socket connector 220 may protrude downwards from a rear surface/bottom surface of the peripheral portion of the socket body 210 and may make contact with the base connector 140. Thus, the socket body 210 may be secured to the base board 130 and be electrically connected to the test channel 120 via the socket connector 220 and the base connector 140.

Accordingly, the test signal may be applied to the PUT secured to the socket board 200 from the test center T via the test channel 120, the base board 130, the base connector 140 and the socket connector 220. An operation signal generated from the PUT in response to the test signal may be transferred to the test center T from each PUT via the socket connector 220, the base connector 140, the base board 130 and the test channel 120.

The active device 230 may be arranged/attached on the rear surface/bottom surface of the socket body 210 and may control the operation of the PUT secured to the corresponding socket board 200. For example, the active device 230 may conduct an electric control for operating the PUT and may generate logic signals for operating the PUT. For example, test signals may be applied to the PUT via the active device 230. For those activations, various operation heats may occur or be generated in the active device 230 in the operation test to the PUT.

The operation heat of the active device 230 may have no effect on a hot operation test to the PUT because the test temperature of the hot operation test may be much higher than that of the operation heat. In contrast, the operation heat of the active device 230 may have significant effect on a cold operation test to the PUT because the operation heat may increase the temperature of the PUT higher than the test temperature of the cold operation test. Thus, the operation heat of the active device 230 may deteriorate the test accuracy of the cold operation test.

The socket board 200 may be detachably combined to the base board 130 and at least a PUT may be secured to the socket board 200. A plurality of socket boards 200 to each of which at least a PUT may be secured may be combined to the base board 130 and the operation test may be simultaneously conducted to a plurality of PUTs on the socket boards 200. Then, when completing the operation test to the plurality of PUTs, the socket boards 200 may be detached from the test board 130 and other socket boards holding other PUTs may be combined to the test board 130.

While the present example embodiment discloses that four PUTs are secured to a single socket board 200, the number of PUTs secured to a single socket board 200 may vary according to the characteristics and requirements of the test apparatus 1000.

The temperature of the socket board 200 may be set to the test temperature by the heat exchange with the heat exchanger 300.

For example, the heat exchanger 300 may be buried at an upper portion U of the base board 130 at a test area A and may make contact with the socket board 200. Thus, the heat exchanger 300 may be interposed between the base board 130 and the socket board 200 at the test area A, so that the temperature of the socket board 200 may be controlled to be set to the test temperature in the operation test, e.g., in the cold operation test, irrespective of the temperature of the base board 130 and the operation heat of the active device 230. Accordingly, the PUTs may be set to the test temperature in the operation test irrespective of the temperature of the base board 130 and the operation heat of the active device 230.

Figure 4A:
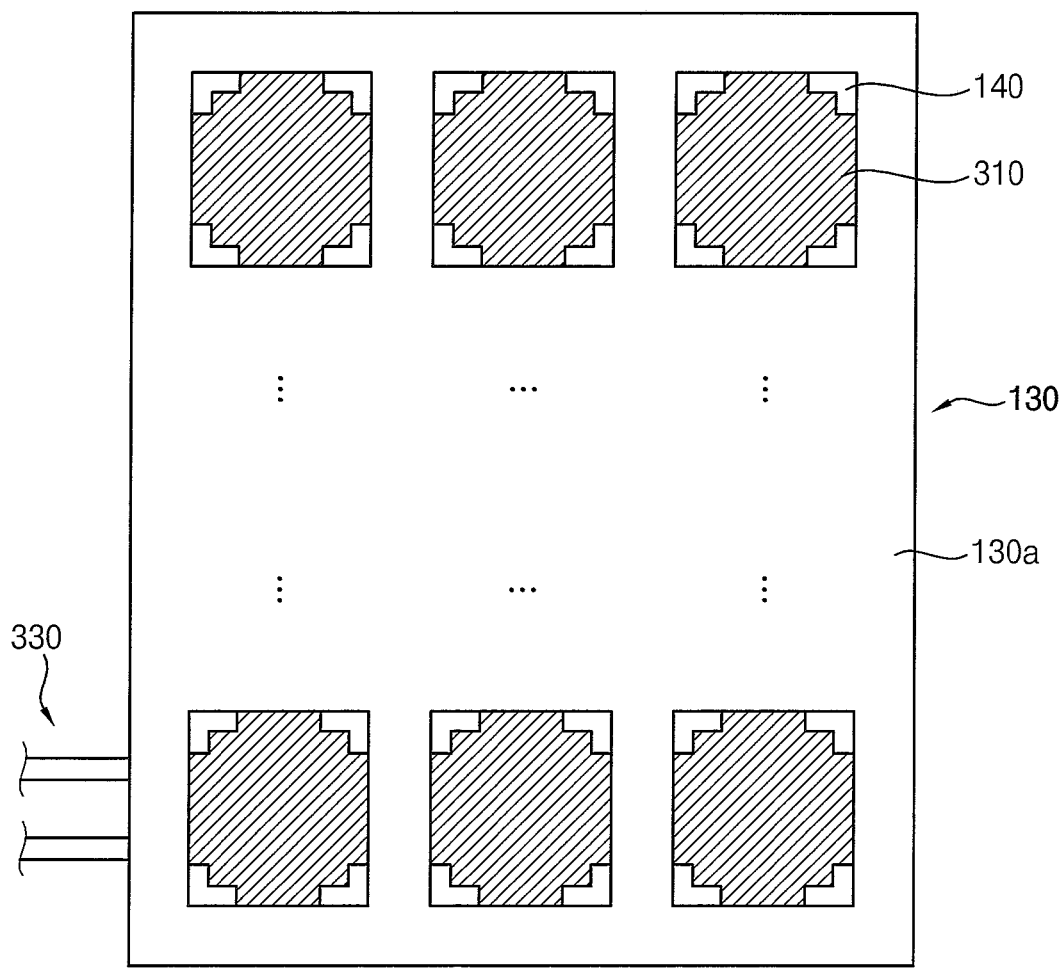
FIG. 4A is a plan view illustrating a heat exchanger of the test apparatus shown in FIG. 1.
Figure 4B:
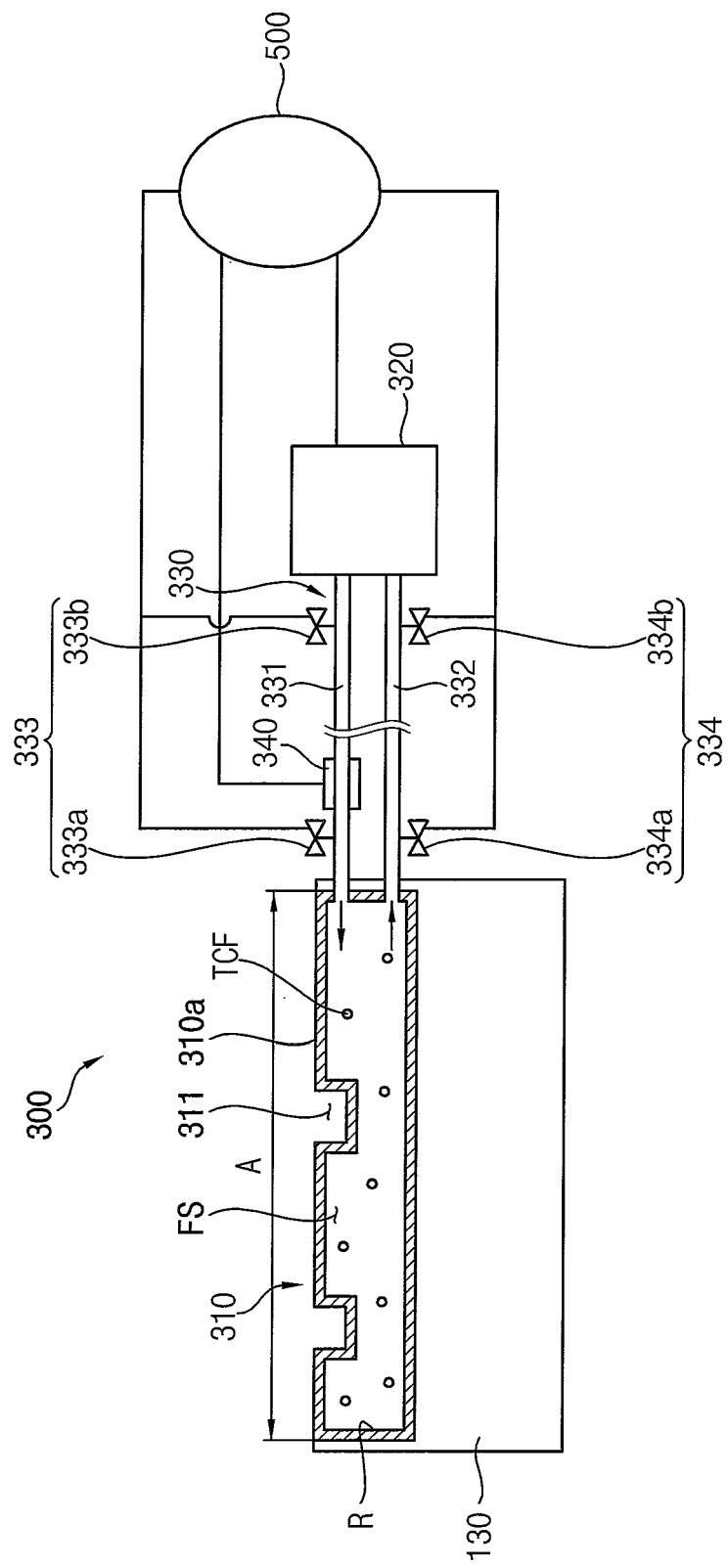
FIG. 4B is a structural view illustrating the heat exchanger shown in FIG. 4A in accordance with an example embodiment of the present inventive concept.

FIG. 4A is a plan view illustrating a portion of the heat exchanger 300 of the test apparatus 1000 shown in FIG. 1 and FIG. 4B is a structural view illustrating a portion of the heat exchanger 300 shown in FIG. 4A in accordance with an example embodiment of the present inventive concept.

Referring to FIGS. 4A and 4B, the heat exchanger 300 in accordance with an example embodiment of the present inventive concept may include a plurality of heat boxes 310, a reservoir 320, and a flow line 330. The plurality of heat boxes 310 may be arranged at an upper portion U of the base board 130 on the plurality of test areas A of the base board 130. Each of the heat boxes 310 may have a flow space FS in which a temperature control fluid TCF may be stored, to thereby conduct a heat exchange with a corresponding socket board 200. The reservoir 320 may be arranged at an exterior of the base board 130 and may accommodate/ contain the temperature control fluid TCF. The flow line 330 may be connected to the plurality of heat boxes 310 and the reservoir 320, and the temperature control fluid TCF may flow between the heat boxes 310 and the reservoir 320 through the flow line 330.

The upper portion U of the base board 130 may be recessed to a preset depth at every test area A, and thus a plurality of test recesses R may be arranged at the upper portion U of the base board 130 at every test area A. Each heat box 310 may be inserted into a corresponding test recess R in such a configuration that a top surface 310a of the heat box 310 may be substantially coplanar with an upper surface 130a of the base board 130. Thus, each test recess R may be filled with a corresponding heat box 310, and the upper surfaces 310a of the heat boxes 310 may have the same level as the upper surface 130a of the base board 130. Therefore, when a socket board 200 is combined to the base board 130 in which a heat box 310 is disposed, the socket board 200 may make contact with the heat box 310 at the corresponding test area A.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

One or more receivers 311 may be arranged/formed on each of heat boxes 310 in such a configuration that an active device 230 is received in a receiver 311 when the socket board 200 is combined to the base board 130. For example, when the socket board 200 is combined to the base board 130, the active device 230 may contact the heat box 310. Thus, the heat box 310 may conduct the heat exchange with the active device 230 as well as with the socket body 210.

For example, the heat box 310 may include or may be a metal box having a sufficiently good thermal conductivity and a flow space FS for storing the temperature control fluid TCF. The temperature control fluid TCF may flow into the flow space FS of the heat box 310 via the flow line 330 and may flow out of the flow space FS of the heat box 310 via the flow line 330. In the present example embodiment, the heat box 310 may include or may be an aluminum box or a copper box having a relatively good thermal conductivity. When the flow space FS of the heat box 310 is filled with the temperature control fluid TCF, the heat exchange may occur between the temperature control fluid TCF and the socket board 200 due to a temperature deviation of the socket board 200 with respect to the temperature control fluid TCF. For example, the temperature control fluid TCF may be set to be a predetermined temperature, and there will be heat exchange between the socket board 200 and the temperature control fluid TCF when the temperature of the socket board 200 and the temperature of the temperature control fluid TCF are different from each other.

The reservoir 320 may be positioned apart from the test head 100 and the temperature control fluid TCF may be maintained under an exchange temperature at which the heat exchange may be sufficiently conducted with the socket board 200. For example, when a cold operation test is conducted to the PUTs, the exchange temperature may be set to be equal to or lower than the test temperature of the cold operation test for dissipating the operation heat from the active device 230.

For example, the exchange temperature of the temperature control fluid TCF may be uniformly maintained in the flow space FS of the heat box 310 by the control of the temperature control center 500. When the cold operation test is conducted to the PUTs and the temperature of the flow space FS increases due to the heat exchange with the active device 230, the temperature control center 500 may control a supply flux and a discharge flux of the temperature control fluid TCF until the temperature of the fluid space SF reaches the exchange temperature, and after that, for the temperature of the fluid space SF to be maintained at the exchange temperature and/or until the socket board 200 is set to the test temperature of the cold operation test.

The temperature control fluid TCF may flow into the heat box 310 through the flow line 330 from the reservoir 320. The flow line 330 may extend from the reservoir 320 and may be branched toward each of the heat boxes 310 of the test areas A of the base board 310, so that the temperature control fluid TCF may be individually controlled to be independently supplied into each of the heat boxes 310 from a single reservoir 320.

The flow line 330 may include a supply line 331 for supplying the temperature control fluid TCF into the flow space FS of each heat box 310, a discharge line 332 for discharging the temperature control fluid TCF from the flow space FS of each heat box 310, a first flow controller 333 arranged on the supply line 331 and controlling a supply flux of the temperature control fluid flowing through the supply line 331 and a second flow controller 334 arranged on the discharge line 332 and controlling a discharge flux of the temperature control fluid TCF flowing through the discharge line 332.

The supply line 331 and the discharge line 332 may include or may be a pipe structure (e.g., a pipe) that may transfer a hot fluid or a cold fluid between the heat box 310 and the reservoir 320.

The first and second flow controllers 333 and 334 may include control valves for controlling the flux of the fluid flowing through the supply line 331 and the discharge line 332 respectively. The first flow controller 333 may include a plurality of first branch valves 333a that are arranged on the supply line 333 close to respective heat boxes 310 and a first master valve 333b that may be arranged on the supply line 333 close to the reservoir 320. In a similar way, the second flow controller 334 may include a plurality of second branch valves 334a that are arranged on the discharge line 334 close to respective heat boxes 310 and a second master valve 334b that may be arranged on the discharge line 334 close to the reservoir 320.

The first and second flow controllers 333 and 334 may be controlled by the temperature control center 500 and may be selectively closed or opened for the uniformity of the exchange temperature in the flow spaces FS of the heat boxes 310.

For example, the first branch valves 333a may be controlled in such a way that the temperature control fluid TCF flows into some of the heat boxes 310 on which the socket boards 200 are disposed/arranged and does not flow into the other heat boxes 310 on which socket boards 200 are not disposed/arranged. For example, the temperature control fluid TCF may be stopped from flowing into the heat boxes 310 on which no socket board 200 is disposed/arranged by closing the corresponding first branch valves 333a. In a similar way, the second branch valves 334a may be controlled in such a way that the temperature control fluid TCF flows out from some of the heat boxes 310 on which the socket boards 200 is disposed/arranged. Thus, the second discharge lines close to the heat boxes 310 on which no socket board 200 is disposed/arranged may not flow the temperature control fluid TCF by closing the second branch valves 334a. Thus, the temperature control fluid TCF may flow into and discharged from the heat boxes 310 just where the socket boards 200 are disposed/arranged on the heat boxes 310.

When a hot test is conducted to the PUT in the test apparatus 1000, the exchange temperature of the temperature control fluid TCF may be set to be higher than the test temperature and thus the heat may be transferred to the socket board 200 from the temperature control fluid TCF. In contrast, when a cold test is conducted to the PUT in the test apparatus 1000, the exchange temperature of the temperature control fluid TCF may be set to be lower than the test temperature and thus the heat may be transferred to the temperature control fluid TCF from the socket board 200. In the present example embodiment, the exchange temperature of the temperature control fluid TCF may be in a range of about −50° C. to about 150° C.

While the present example embodiment discloses that the temperature control fluid TCF may be individually supplied to and discharged from each of the heat boxes 310 of the test areas A through the flow line 330, various flow transfer configurations may also be provided to the test apparatus 1000 for transferring the temperature control fluid TCF between the reservoir 320 and the heat boxes 310.

For example, when a coolant is used as the temperature control fluid for the cold test, the flow line 330 may include a coolant path having a path gradient (e.g., an inclination) by which the coolant may flow by the path gradient (e.g., by the inclination of the coolant path) in such a direction that the temperature deviations of the socket boards 200 decrease.

For example, a local temperature controller 340 may be arranged on the supply line 331 close to each first branch valve 333a, so that the exchange temperature of the temperature control fluid TCF may be individually controlled in each heat box 310 in the corresponding test area A.

A temperature deviation may occur between the test areas A according to the configurations and characteristics of the base board 130. For example, the temperature of the test areas A at a central portion of the base board 130 may be generally different from those of the test areas A at a peripheral portion of the test board 130 according to the characteristics and configurations of the base board 130 and the flow line 330. Thus, even though the temperature control fluid TCF may have a uniform temperature in the reservoir 320, the exchange temperature of the temperature control fluid TCF may vary between heat boxes 310 in different positions, e.g., between the central portion and the peripheral portion of the base board 130.

The local temperature controller 340 may individually control the individual temperature of the temperature control fluid TCF in each heat box 310 in such a way that the temperature control fluid TCF may have a uniform exchange temperature across all the heat boxes 310.

The local temperature controller 340 may work under the control of the temperature control center 500. The temperature control center 500 may monitor temperatures of the socket boards 200, and may detect a socket board 200 of which temperature is locally deviated from the test temperature and recognize as a deviated socket. The temperature control center 500 may individually control a corresponding local temperature controller 340 to increase or decrease the temperature of the temperature control fluid TCF that flows into each deviated socket. Thus, the uniformity of the exchange temperature of the temperature control fluid TCF may be sufficiently improved in each of the heat boxes 310.

For example, deviated sockets may include the peripheral socket boards 200 that may be arranged in the peripheral area of the test board 130. However, the deviated sockets may include any other socket boards 200 of which the temperature may be deviated from the test temperature in spite of the heat exchange between the temperature control fluid TCF and each socket board 200 according to the configurations of the test apparatus 1000 and the characteristics of the operation test to the PUTs. The deviated sockets may be designated in advance prior to the operation test to the PUTs. For example, temperatures of the socket boards 200 may be checked before each operation test and/or while operation tests are performed.

For example, the local temperature controller 340 may include or may be a thermoelectric element that may be installed to the supply line 331 close to the corresponding heat box 310. Thus, when the thermoelectric element is operated by the temperature control center 500, the temperature of the temperature control fluid TCF may individually increase or decrease at the heat boxes 310 just making contact with the deviated sockets, so that the exchanging temperature may be set to be uniform across all the heat boxes 310 and/or a predetermined test temperature may be maintained in all operating socket boards 200.

When the hot test is conducted to the PUTs in the test apparatus 1000, the deviated socket may have a deviated temperature that may be slightly lower than the hot test temperature due to the configurations of the base board 130 and the characteristics of the hot test. In such a case, the local temperature controller 340 may slightly increase the temperature of the temperature control fluid TCF to be higher than the exchange temperature in such a way that the deviated socket may also be set to the hot test temperature by the heat exchange between the temperature control fluid TCF and the deviated socket. In contrast, when the cold test is conducted to the PUTs in the test apparatus 1000, the deviated socket may have a deviated temperature that may be slightly higher than the cold test temperature due to the configurations of the base board 130 and the characteristics of the cold test. In such a case, the local temperature controller 340 may slightly decrease the temperature of the temperature control fluid TCF to be lower than the exchange temperature in such a way that the deviated socket may also be set to the cold test temperature by the heat exchange between the temperature control fluid TCF and the deviated socket.

Referring again to FIG. 1, the test chamber 400 may be combined to the test head 100 in such a configuration that a closed test space S is provided between the test chamber 400 and the test head 100 and the PUT may be arranged in the test space S. As the test space S may be isolated from surroundings in the operation test to the PUTs, the base board 130, the socket boards 200 and the PUTs may be isolated from surroundings in the operation test in the test apparatus 1000.

For example, the test chamber 400 may include a housing 410 combined to the test head 100 to form the test space S therein and a test fluid supplier 420 arranged at an outside of the housing 410 and supplying a test fluid TF into the housing 410.

The housing 410 may include materials and configurations to accommodate the cold test and the hot test in the test space S. For example, the housing 410 may include or may be made of a metal or an alloy of metals. In the present example embodiment, the test fluid TF may include or may be air and the test fluid supplier 420 may include or may be an air blower for forcibly circulating the air in the test space S.

The test fluid TF may be supplied into the housing 410 at the uniform test temperature and may be forcibly circulated in the test space S. Thus, the PUT may be positioned in an ambient of the test fluid TF under the test temperature. Therefore, upper portions of the PUTs may be uniformly set to the test temperature in the operation test.

In such a case, the lower portion of the socket boards 200 may also be set to the test temperature by the heat exchange between the temperature control fluid TCF and the socket boards 200, so that lower portions of the PUTs may also be uniformly set to the test temperature in the operation test. Accordingly, the upper portions and the lower portions of the PUTs may be uniformly set to the test temperature during the operation test in the test apparatus 1000.

When the PUTs are set to the test temperature in the test space S, the test signal may be applied to the PUTs and then the operation test may be initiated in the test apparatus 1000.

The lower portions of the PUTs may be set to the test temperature by the heat exchange between the temperature control fluid TCF in the heat boxes 310 and the socket boards 200.

The temperature control fluid TCF may flow into the heat boxes 310 through the supply line 331 in the test areas A of the base board 130 at the exchange temperature. In such a case, the temperature uniformity of the temperature control fluid TCF may be improved across the socket boards 200 by the local temperature controller 340.

The temperature control center 500 may be provided in the test apparatus 1000 as an additional control center or may be provided as a component controller of the test center T that controls the operation of the test head 100.

The test center T may control the test head 100, the socket boards 200, the heat exchanger 300 and the test chamber 400 and may control the operation test to the PUTs in the test apparatus 1000.

According to example embodiments of the test apparatus 1000, the semiconductor packages under test (PUTs) may be mounted on the socket boards 200 in the test areas A and then the upper portions and the lower portions of the PUTs may be individually set to the test temperature by the test fluid TF and the temperature control fluid TCF. The test fluid TF may be supplied into the test chamber 400 and be forcibly circulated in the test space S in such a way that the temperature of the test space S reaches test temperature. Thus, the upper portions of the PUTs may be set uniformly to the test temperature. In addition, the lower portions of the PUTs may also be set to the test temperature by the heat exchange between the temperature control fluid TCF in the heat boxes 310 and the socket boards 200.

Figure 5:
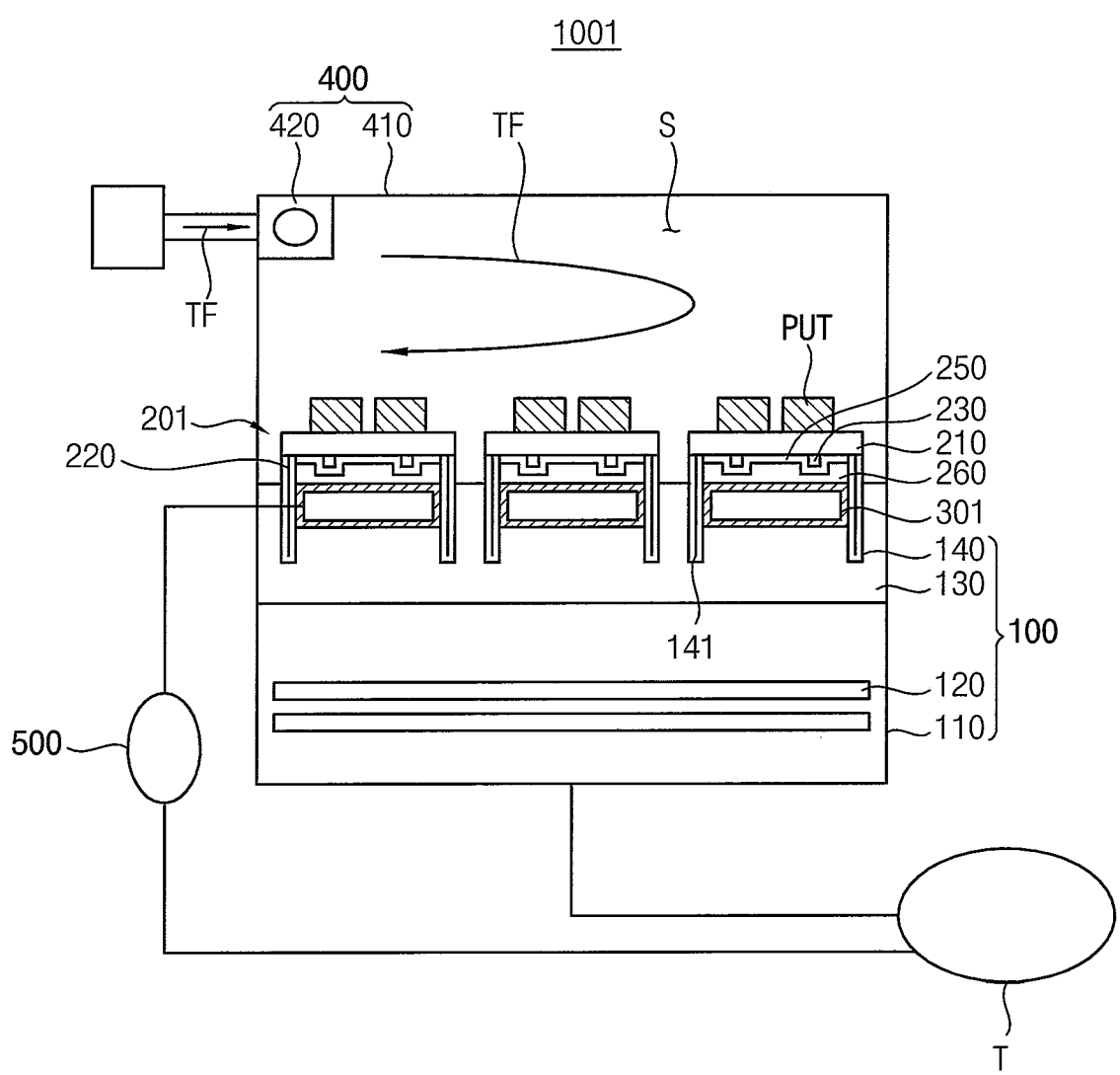
FIG. 5 is a structural view illustrating a test apparatus for testing semiconductor packages in accordance with another example embodiment of the present inventive concept.
Figure 6:
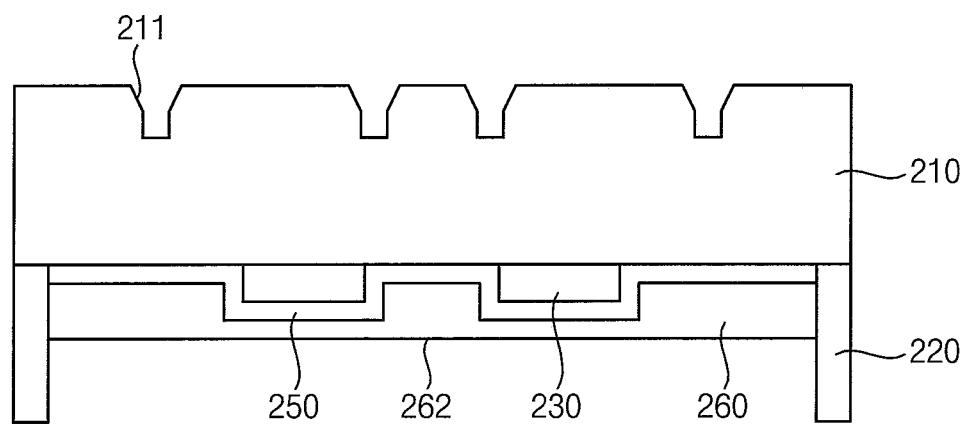
FIG. 6 is a cross sectional view illustrating a socket board of the test apparatus shown in FIG. 5.
Figure 7:
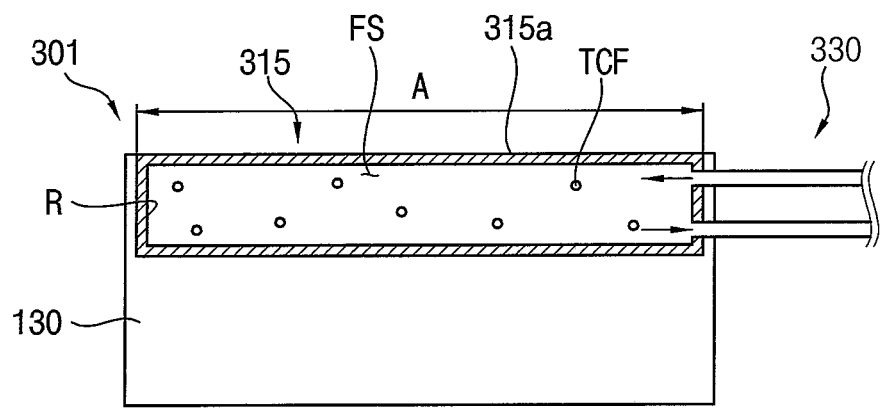
FIG. 7 is a cross sectional view illustrating a flat heat exchanger of the test apparatus shown in FIG. 5.

FIG. 5 is a structural view illustrating a test apparatus 1001 for testing semiconductor packages in accordance with another example embodiment of the present inventive concept, and FIG. 6 is a cross sectional view illustrating a socket board 201 of the test apparatus 1001 shown in FIG. 5. FIG. 7 is a cross sectional view illustrating a heat exchanger 301 of the test apparatus 1001 shown in FIG. 5.

In FIGS. 5 to 7, the test apparatus 1001 in accordance with another example embodiment of the present inventive concept may have the same structures as the test apparatus 1000 shown in FIG. 1 except for the socket board 201 and the heat exchanger 301. Thus, In FIGS. 5 to 7, the same reference numerals denote the same elements in FIG. 1 and any further detailed descriptions on the same elements will be omitted hereinafter.

Referring to FIGS. 5 to 7, the test apparatus 1001 in accordance with another example embodiment of the present inventive concept may include a flat socket board 201 and a flat heat exchanger 301 making contact with the flat socket board 201.

The flat socket board 201 may include a flat contact surface 262 and no receiver for receiving active devices 230 may be provided in the flat heat exchanger 301. Thus, the flat heat exchanger 301 may have a flat upper surface 315*a* making contact with the flat contact surface 262 of the flat socket board 201. For example, heat boxes 315 of the flat heat exchanger 301 may not have a receiver for receiving an active device 230 on its upper surface 315a.

For example, the flat socket board 201 may include a thermal adhesive 250 covering a socket body 210 along a surface profile of the active devices 230 and the socket body 210, and may include a heat transfer plate 260 covering the thermal adhesive 250 to fill up recessed portions of the surface profile of the thermal adhesive 250 caused by the active devices 230 and having the flat contact surface 262. Thus, the active devices 230 may be covered with the thermal adhesive 250.

The thermal adhesive 250 may include a dissipating adhesive tape and a thermal interface material (TIM) such as a thermal grease and a thermoplastic elastomer that may adhere to the lower surface of the socket body 210. The dissipating adhesive tape and the TIM may fill up irregular voids of the lower surface of the socket body 210, to increase the efficiency of the heat transfer between the socket body 210 and the heat transfer plate 260.

The heat transfer plate 260 may have an uneven surface and a flat surface opposite to the uneven surface. The thermal adhesive 250 may be in contact with the uneven surface of the heat transfer plate 260, so that the surface profile of the thermal adhesive 250 may be filled up with a portion having the uneven surface of the heat transfer plate 260. Thus, the even surface of the heat transfer plate 260 may function as a rear surface of the flat socket board 201. As the active devices 230 is covered by the thermal adhesive 250 and the even surface of the heat transfer plate 260 has a flat surface, the rear surface of the flat socket board 201 may be a flat surface. As making contact with the heat exchanger 301, the flat surface of the heat transfer plate 260 may be provided as the flat contact surface 262 of the flat socket board 201. The heat transfer plate 260 may have such a large heat transfer coefficient that the heat is sufficiently well exchanged between the socket body 210 and the heat box 310 through the heat transfer plate 260. Thus, the lower portion of the socket body 210 may be rapidly set to the test temperature for the operation test by the thermal exchange. In the present example embodiment, the heat transfer plate 260 may include or may be formed of aluminum (Al), copper (Cu), gold (Au), silver (Ag) or an alloy thereof.

For example, when the cold test is conducted to the PUTs, the operation heat of the active device 230 and the PUT may be sufficiently dissipated into the flat heat exchanger 301. Thus, the socket boards 200 and the PUTs may be uniformly and rapidly set to the cold test temperature.

While the present example embodiment discloses the thermal adhesive 250 covering the socket body 210 and the heat transfer plate 260 covering the thermal adhesive 250, one or more additional heat transfer members may also be arranged between the socket body 210 and the flat heat exchanger 301 in certain embodiments as long as the heat exchange between the socket body 210 and the flat heat exchanger 301 is sufficiently well conducted.

The flat heat exchanger 301 may include a plurality of flat heat boxes 315 each of which may have substantially the same structures as the heat box 310 of the heat exchanger 300 as shown in FIGS. 4A and 4B, except that the receiver 311 is not provided in the flat heat box 315. Thus, a similar flow space FS to the heat boxes 310 may also be provided in each of the flat heat boxes 315 as shown in FIG. 7.

Thus, an upper surface of the flat heat box 315 may be substantially flat (referred to as flat upper surface 315a) and the flat contact surface 262 of the flat socket board 201 may be in contact with the flat upper surface 315a of the corresponding flat heat box 315.

For example, the heat transfer plate 260 may be provided in the socket body 210 as one body and the flat heat box 315 may be provided on the base board 130 in one body, e.g., attached on the base board 130. Thus, the flat upper surface 315a may make contact with the flat contact surface 262 just by combining the flat socket board 201 with the base board 130, e.g., before an operation test is performed.

Being provided as a consumable part of the test apparatus 1001 having a lifetime, the flat socket board 201 may be replaced with a new one after the lifetime. Thus, the flat socket board 201 may be controlled to make contact with the flat upper surface 315a of the flat heat box 315 at each time when the flat socket board 201 is replaced. Accordingly, the lower portion of the PUTs may be set to the test temperature by heat exchange with the flat heat exchanger 301 through the flat socket board 201.

Figure 8A:
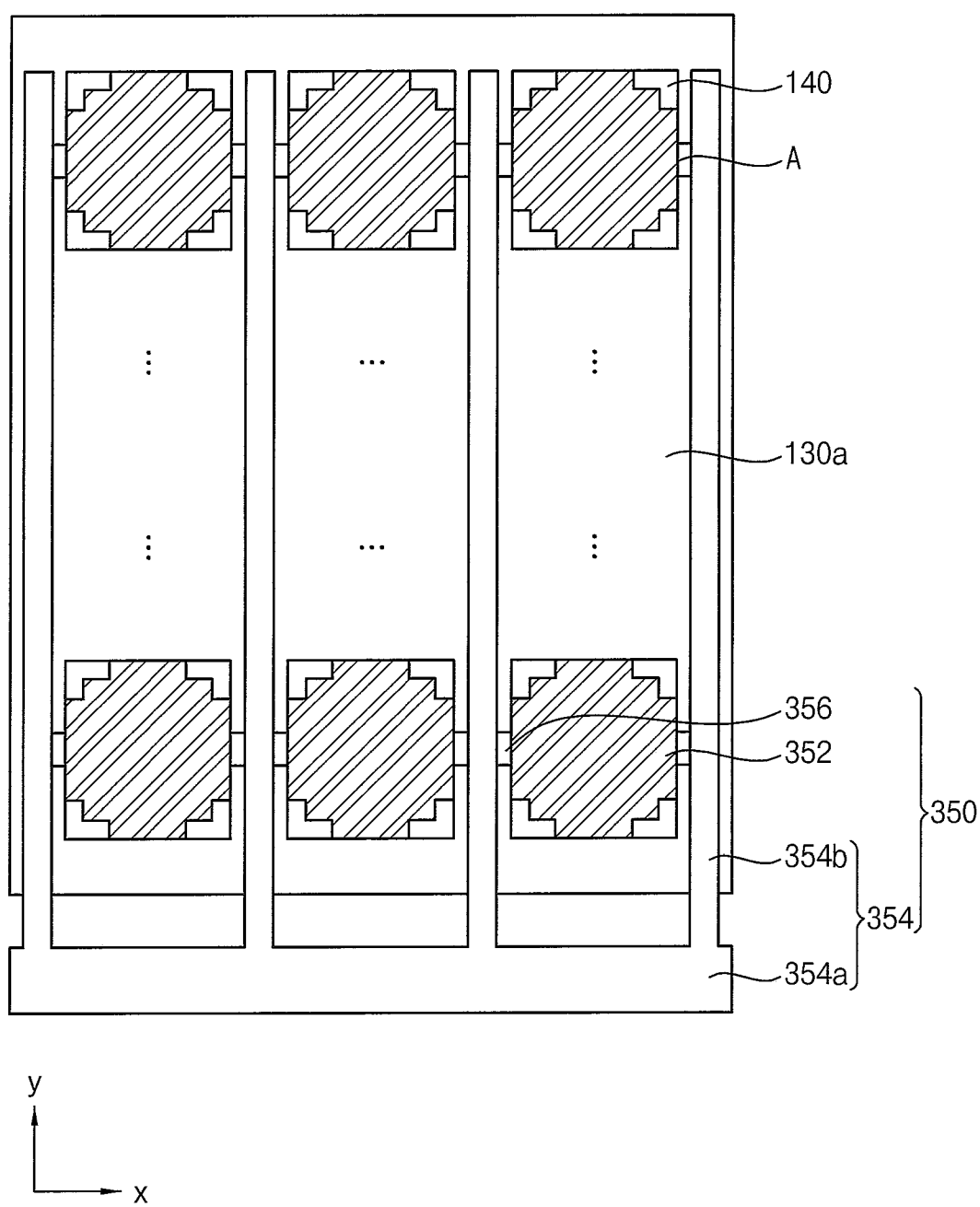
FIG. 8A is a plan view illustrating a modification of the flat heat exchanger shown in FIG. 7 in accordance with another example embodiment of the present inventive concept.
Figure 8B:
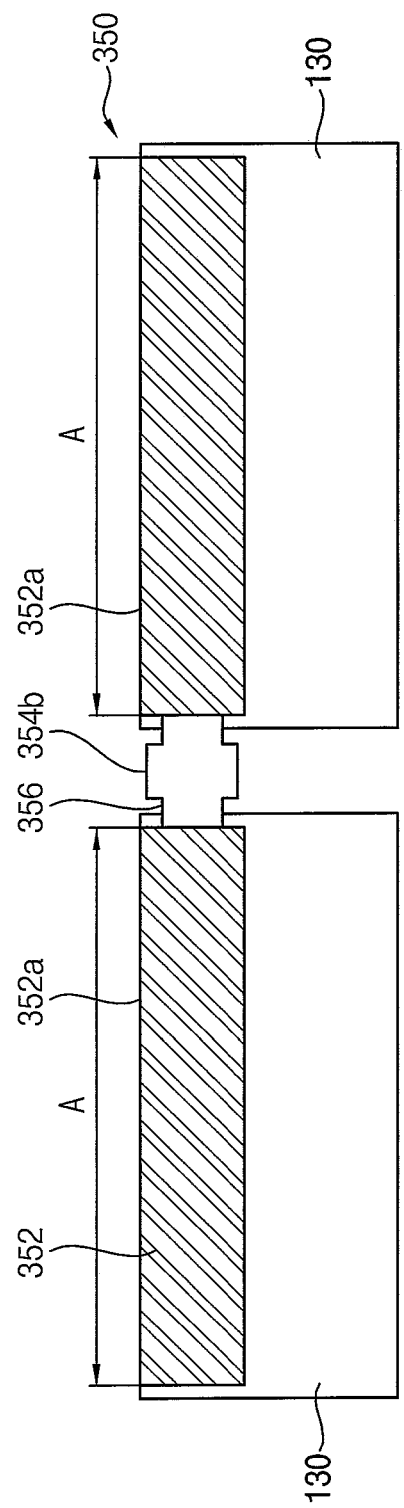
FIG. 8B is a cross sectional view illustrating the modification of the flat heat exchanger shown in FIG. 8A.

FIG. 8A is a plan view illustrating a modification of the flat heat exchanger shown in FIG. 7 in accordance with another example embodiment of the present inventive concept and FIG. 8B is a cross sectional view illustrating the modification of the flat heat exchanger shown in FIG. 8A.

Referring to FIGS. 8A and 8B, a flat heat exchanger 350 may include a plurality of heat bodies 352, at least one temperature control line 354 for controlling a temperature of the heat bodies 352 and a plurality of connectors 356 connected to the temperature control line 354 and the plurality of heat bodies 352, respectively, to selectively heat or cool down the respective heat body 352.

For example, the heat bodies 352 may include respective bulk/solid bodies that may be buried/disposed in the test recesses R of the base board 130 at respective test areas A and may have respective flat upper surfaces 352a making contact with the heat transfer plates 260 of the flat socket boards 201.

For example, the heat bodies 352 may include heat transfer elements such as Peltier modules and/or heat sinks and the flat upper surfaces 352a of the heat bodies 352 may be flat. The flat upper surfaces 352a of the heat bodies 352 may make contact with the heat transfer plates 260 of the flat socket boards 201. Thus, the heat bodies 352 may conduct heat exchange with the active devices 230 as well as the socket bodies 210.

The temperature of the heat bodies 352 may be controlled by the temperature control line 354 and the connectors 356. When the heat bodies 352 include the Peltier modules, the temperature control line 354 may include a power line for applying an electric power to the Peltier modules. In such a case, the connectors 356 may include switches for selectively switching on or off the electric power to the Peltier modules. The heat bodies 352 may be selectively heated by turning on the Peltier modules, thus the flat socket boards 201 may be selectively heated according to the requirements of the operation test to the PUTs.

When the heat bodies 352 include the heat sinks, the temperature control line 354 may include a dissipating line for dissipating heat from the heat sinks. In such a case, the connectors 356 may include heat block elements for selectively blocking or preventing the heat transfer between the heat sinks and the dissipating line. Thus, the operation heat of the PUTs and the active devices 230 may be dissipated into the heat sinks and the heat of the heat sinks may be selectively cooled down by the heat block elements. For example, each of the connectors 356 may include a heat block configured to selectively block a heat transfer between its corresponding heat sink and dissipating line.

For example, the temperature control line 354 may include a power line for applying an electric power to the heat bodies 352 or a dissipating line for dissipating heat from the heat bodies 352. The temperature control line 354 may include a main line 354a extending in a first direction x and arranged at a side of the base board 130 and at least one branch line 354b branching off from the main line 354 in a second direction y and arranged at a side of a column of the test areas A of the base board 130. In the present example embodiment, the second direction y may be substantially perpendicular to the first direction x and a number of the branch lines 354b may be arranged alternately with a number of the columns of the test areas A. The connectors 356 may be interposed between every heat body 352 and every branch line 356b. For example, each heat body 352 may be connected to two branch lines 354b extending on both sides of each heat body 352 via corresponding connectors 356 interposed between each heat body 352 and adjacent two branch lines 354b.

Thus, the temperature of the heat bodies 352 may be individually controlled by the connection or disconnection of the connectors 356 to the branch lines 354b in respective test areas A. The connection or disconnection of the connectors 356 may be controlled by the temperature control center 500 in such a way that the plurality of heat bodies 352 may be set to a uniform test temperature across all the test areas A.

Figure 9:
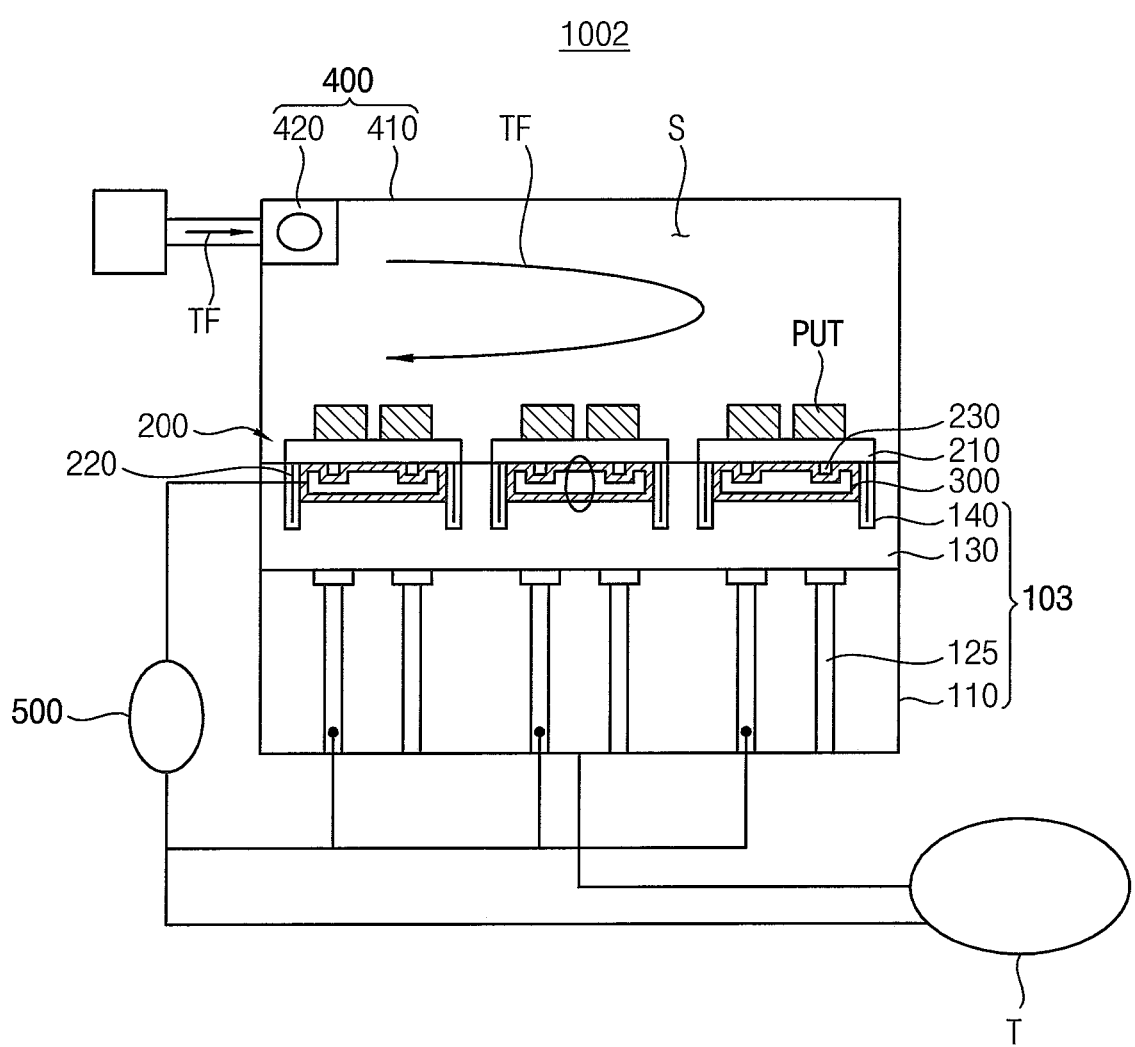
FIG. 9 is a structural view illustrating a test apparatus for testing semiconductor packages in accordance with still another example embodiment of the present inventive concept.

FIG. 9 is a structural view illustrating a test apparatus 1002 for testing semiconductor packages in accordance with another example embodiment of the present inventive concept. In FIG. 9, the test apparatus 1002 may have the same structures as the test apparatus 1000 shown in FIG. 1 except for a modified test head 103 including a plurality of site boards 125. Thus, in FIG. 9, the same reference numerals denote the same elements in FIG. 1 and further detailed descriptions on the same elements will be omitted hereinafter.

Referring to FIG. 9, the test apparatus 1002 may include a plurality of site boards 125 in place of the test channels 120 of the previous embodiments.

The plurality of site boards 125 may be arranged in the head chamber 110 in such a configuration that each of the site boards 125 is connected to each of the test areas A of the test board 130. Thus, test signals may be individually transferred to the socket board 200 at each test area A and operation signals may be individually detected from the PUTs mounted on a socket board 200 at each test area A by using the corresponding site board 125.

Thus, the transfer of the test signals and the detection of the operation signals may be simultaneously conducted to multiple PUTs on each of the socket boards 200 independently from the other PUTs. For example, the operation test may be individually conducted to each of the PUTs and the site board 125 may function like the test center T of the previous embodiments to the corresponding PUTs at each test area A.

In such a case, each of the site boards 125 may include all of the functional units for conducting the operation test to the corresponding PUTs, so that the configurations of the site boards 125 may vary according to the characteristics of the operation tests to the PUTs and the characteristics of the PUTs.

Accordingly, a plurality of independent operation tests may be individually conducted to a plurality of PUTs in the test apparatus 1002 by using the site boards 125. For example, when the PUTs include a multi-chip package having various different kinds of chips such as a plurality of memory chips and a single logic chip, the operation test to the memory chip and the logic chip may be individually conducted independently from the memory chip and the logic chip in the test apparatus 1002.

For example, the site board 125 may include a central process unit for processing test signals transferred from the test center T and the operation signals detected from the corresponding PUTs, a pattern generator for generating logic data pattern, a timing signal generator for generating a reference clock for the corresponding PUTs, a format controller for generating an expected timing edge, a pin electronics (PE) for applying a test current or a test voltage to the corresponding PUTs in responsive to the test signals and a memory device storing operation test results to the corresponding PUTs including fail data indicating the operation defects. Thus, each of the site boards 125 may conduct a sufficient operation test to the PUTs and analyze the operation defects or failures of the corresponding PUTs.

In a modified example embodiment, a plurality of input/output channels (I/O channels) may be provided in each site board 125 and the site board 125 may be connected to a plurality of PUTs as many as the number of the I/O channels. Thus, multiple operation tests may be simultaneously conducted to the PUTs that may be connected to the I/O channels of the site board 125. A plurality of site boards 125 may be connected to each other by a bus line and may communicate and be synchronized with one another.

As the test center T may be connected to the temperature control center 500 and the site boards 125, the PUTs may be set to the test temperature by the temperature control center 500 and each of the PUTs may experience the operation test under the test temperature by the corresponding site board 125. Accordingly, the PUTs may be individually tested by the site boards 125 under the uniform test temperature in the test apparatus 1002.

While the present example embodiment discloses that the heat exchanger 300 may include the heat boxes 310 having at least one receiver 311 for receiving the active devices 230, modifications may also be allowable to the socket board 200 and the heat exchanger 300. For example, the socket board 200 of the test apparatus 1002 may be replaced with the flat socket board 201 as shown in FIG. 6 and the heat exchanger 300 may be replaced with the flat heat exchanger 301 as shown in FIG. 7 or with the flat heat exchanger 350 as shown in FIG. 8B.

Figure 10:
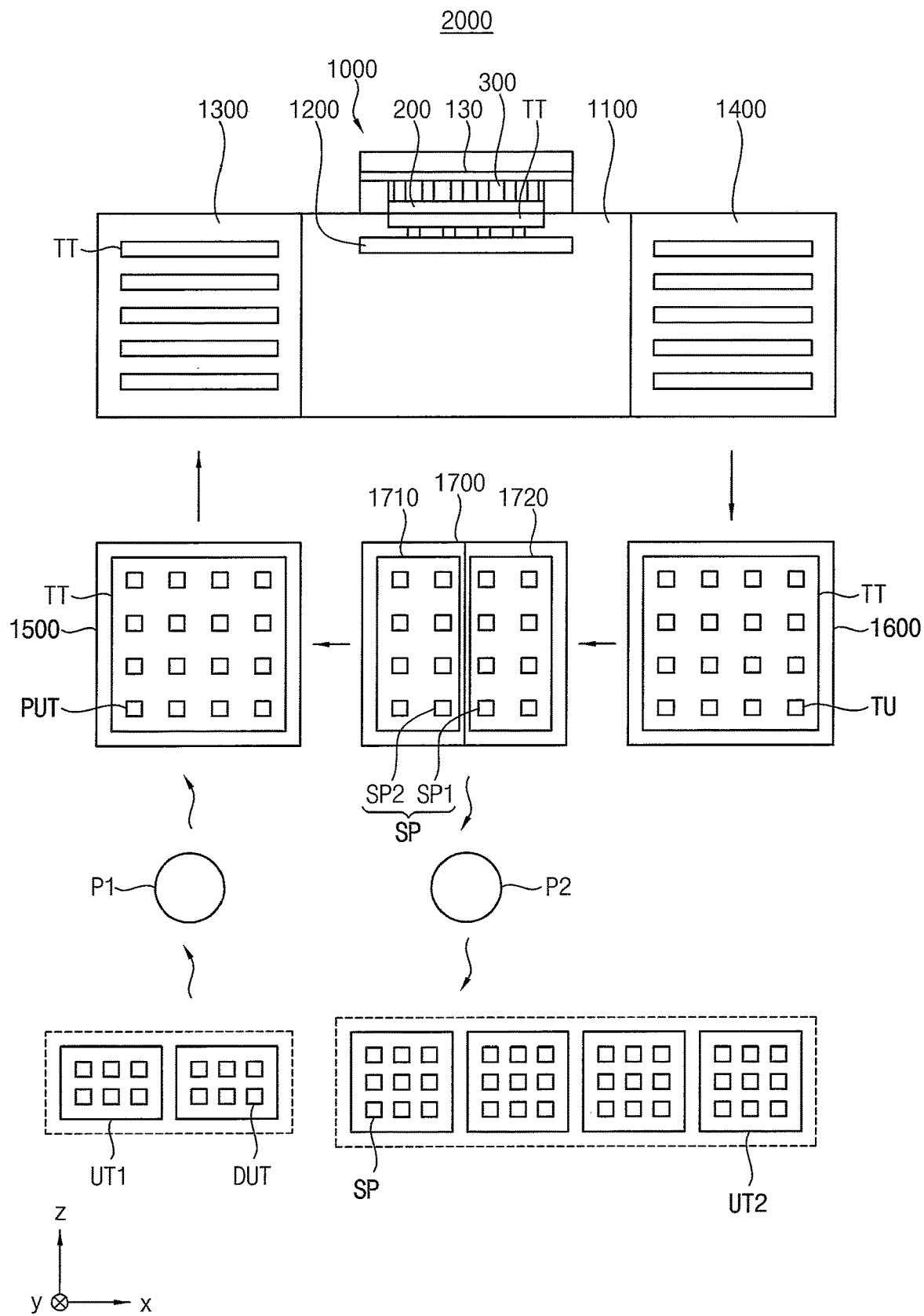
FIG. 10 is a structural view illustrating an automatic test equipment (ATE) for testing semiconductor packages in accordance with an example embodiment of the present inventive concept.
Figure 11:
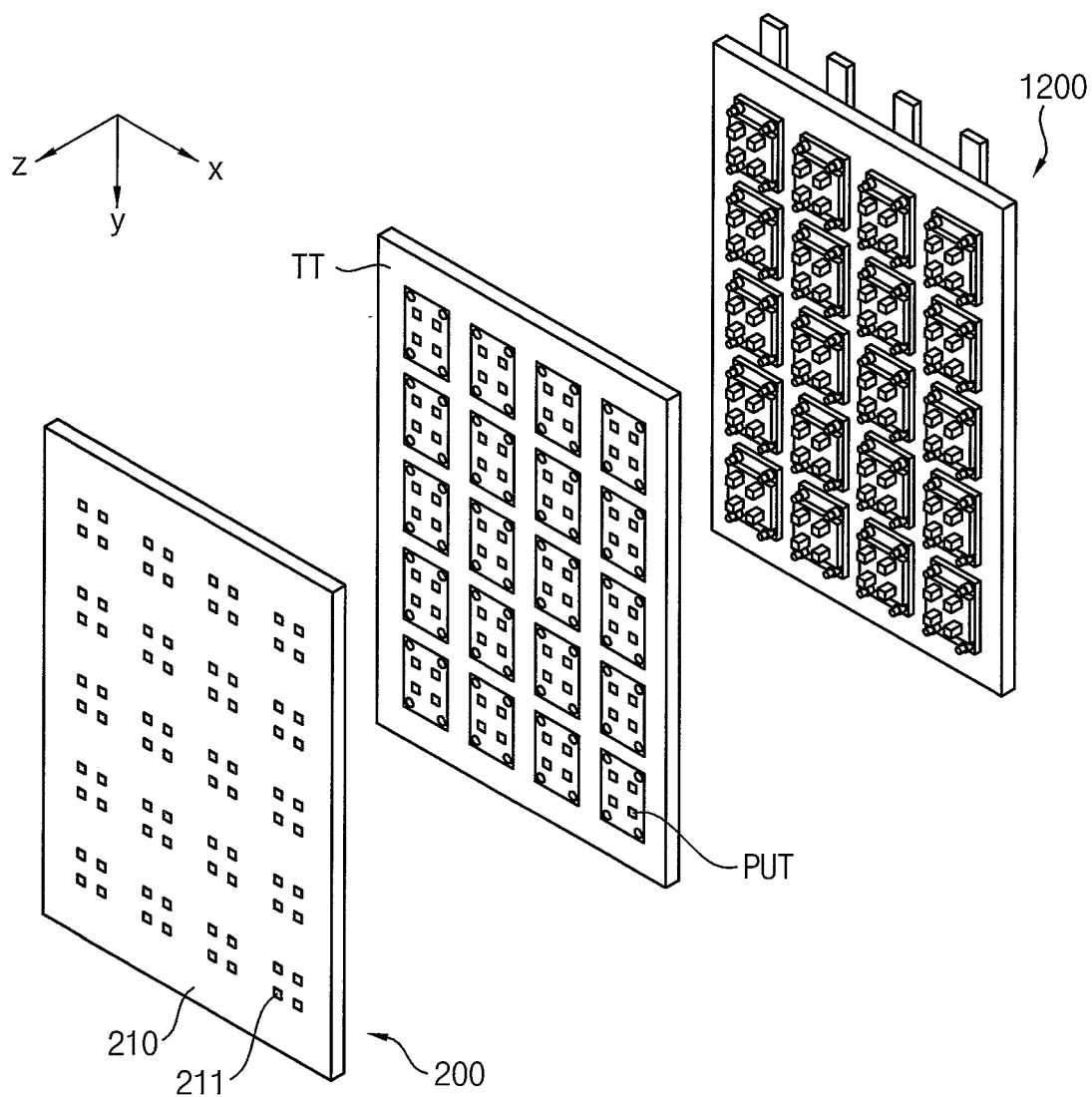
FIG. 11 is an explosive perspective view illustrating a socket board, a test tray and a pusher of the ATE shown in FIG. 10.

FIG. 10 is a structural view illustrating an automatic test equipment (ATE) for testing semiconductor packages in accordance with an example embodiment of the present inventive concept and FIG. 11 is an explosive perspective view illustrating a socket board, a test tray and a pusher of the ATE shown in FIG. 10. The ATE shown in FIG. 10 may include any one of the test apparatuses 1000, 1001 and 1002 as described in detail with references to FIGS. 1 to 9. Thus, in FIGS. 10 and 11, the same reference numerals denote the same elements in FIGS. 1 to 9 and further detailed descriptions on the same elements will be omitted hereinafter.

Referring to FIGS. 10 and 11, an automatic test equipment (ATE) 2000 for testing semiconductor packages in accordance with an example embodiment of the present inventive concept may include a test apparatus 1000, a loading chamber 1300, an unloading chamber 1400, a loader 1500, an unloader 1600, and a sorter 1700. The test apparatus may include a plurality of socket boards 200 onto which the semiconductor packages under test (PUTs) may be secured and a heat exchanger 300 making contact with the socket boards 200. An operation test may be conducted to the PUTs in the test apparatus 1000. The test apparatus may include a test chamber 1100 in which a plurality of test trays TT holding the PUTs may be aligned with the plurality of socket boards 200 and a pusher 1200 arranged in the test chamber 1100 and configured to push the PUTs in the test trays TT towards the socket boards 200.

For example, the loader 1500 may mount the PUTs on the corresponding test tray TT and loading a plurality of test trays holding the PUTs into the test chamber 1100. The unloader 1600 may unload tested packages TU from the unloading chamber 1400. The sorter 1700 may sort the tested packages TU into non-faulty packages SP1 and faulty packages SP2.

A plurality of PUTs may be received in a first user tray UT1 and the first user tray UT1 may be loaded into the loader 1500. Then, each of the PUTs may be individually picked up from the first user tray UT1 and mounted onto the test tray TT by a first picker assembly P1.

A plurality of PUTs may be mounted on each of test trays TT and a plurality of test trays TT may be transferred into a loading chamber 1300. Then, each of the test trays TT may be supplied into the test chamber 1100 for the automatic operation test. For example, the operation test may be conducted on the test tray TT, and thus a plurality of PUTs mounted on the same test tray TT may be simultaneously tested in the ATE 2000.

The test apparatus 1000 may conduct the operation test to the PUTs on the test tray TT in the test chamber 1100. Test signals may be applied to the PUTs and operation signals may be detected from the PUTs and be analyzed in the test apparatus 1000.

A number of the PUTs may be combined to the socket boards 200 and may be electrically connected to the test head 100. For example, four PUTs may be combined to a single socket board 200 and each of the PUTs may be secured to the corresponding socket board 200 by a plurality of securing members 211. Then, the socket board 200 may be combined to the base board 130 in such a way that the PUTs, the socket board 200 and the base board 130 may be electrically connected to each other. While the present example embodiment discloses that four PUTs are secured to a single socket board 200, the number of the PUTs secured to the single socket board 200 may vary according to the ATE 2000 and the requirements of the operation test.

The pusher 1200 may be arranged in the test chamber 1100 and may individually push the PUTs towards the securing members 211 of the socket board 200 from the test tray TT. Thus, each of the PUTs may be individually secured to the socket board 200 by the corresponding securing member 211.

When all the PUTs are secured to the socket boards 200 in the test chamber 1100, the test chamber 1100 may be closed and isolated from surroundings. Then, the inner space of the test chamber 1100 may be changed into a closed test space S that may be isolated from surroundings. The test fluid TF may be supplied into the test space S. The test fluid TF may be at a predetermined test temperature. Accordingly, upper portions of the PUTs may be uniformly set to the test temperature in the test space S. For example, the test space S above the PUTs may have a uniform test temperature throughout the test space S, and the upper portions of the PUTs may be at the same temperature as the test space S.

A heat exchanger 300 may be buried into or disposed on the upper portion of the base board 130 and a plurality of socket boards 200 may be combined to the base board 130 in such a configuration that the socket boards 200 are arranged on the base board 130 in respective test areas A and in contact with the heat exchanger 300. The temperature of the heat exchanger 300 may be accurately controlled by the temperature control center 500 until lower portions of the socket boards 200 are uniformly set to the test temperature. Accordingly, lower portions of the PUTs may also be uniformly set to the test temperature during the automatic operation test is performed. The socket boards 200 and the heat exchanger 300 may have substantially the same structures as the embodiments described in detail with references to FIGS. 1 to 9, and thus any detailed descriptions on the socket boards 200 and the heat exchanger 300 will be omitted below.

Accordingly, the lower portions of the PUTs may be uniformly set to the test temperature as well as the upper portions of the PUTs, so that the PUTs may be maintained under the uniform test temperature in the automatic operation test, to thereby sufficiently improve the accuracy and reliability of the automatic operation test to the PUTs in the ATE 2000.

The test signals may be applied to the PUTs under the uniform test temperature and the operation signals may be detected from the PUTs under the uniform test temperature. For example, the operation signals may be generated from the PUTs while the PUTs maintain the uniform test temperature. The operation signals may be analyzed in the test apparatus 1000. A test result such as a fault package or a non-fault package may be marked onto each of the PUTs according to the analysis of the operation signals.

When the operation test is completed to the PUTs in the test chamber 1100, the test tray TT on which the tested packages TU are mounted may be unloaded into the unloading chamber 1400. For example, the unloading chamber 1400 may include or may be a de-soak chamber in which the temperature of the tested packages TU are returned to an atmospheric temperature.

Then, the test tray TT holding the tested packages TU may be transferred to the unloader 1600 and may be sorted into non-faulty sorted packages SP1 and faulty sorted packages SP2 in the sorter 1700. The non-faulty sorted packages SP1 may be received in a first sorting table 1710 and the faulty sorted packages SP2 may be received in a second sorting table 1720 in the sorter 1700. The non-faulty sorted packages SP1 may be individually picked up from the first sorting table 1710 and may be individually received in a second user tray UT2 by a second picker assembly P2, and then the second user tray UT2 may be transferred to a next process for the non-faulty sorted packages SP1. In a similar way, the faulty sorted packages SP2 may also be individually picked up from the second sorting table 1720 and may be individually received in another second user tray UT2 by the second picker assembly P2, and then the second user tray UT2 may be transferred to a next process for the faulty sorted packages SP2.

According to the above example embodiments of the ATE 2000, a heat exchanger 300 may be buried on the upper portion of the base board 130 and the socket boards 200 on which a plurality of PUTs is secured may be combined to the base board 130 in respective test areas A in such a configuration that the socket boards 200 and the heat exchanger 300 make contact with each other. Thus, the lower portions of the PUTs may be uniformly set to a predetermined test temperature of the operation test by heat exchange between the socket boards 200 and the heat exchanger 300. As the temperature of the upper portions of the PUTs is uniformly set to the test temperature of the operation test by the test fluid TF in the test space S of the test chamber 1100 and the temperature of the lower portions of the PUTs are set to the test temperature by the heat exchanger 300, the operation test may be conducted to the PUTs under the uniform test temperature, to thereby improve the accuracy and reliability of the operation test in the ATM.

For example, when the cold test is conducted to the PUTs in the ATE 2000, the operation heats generated from the PUTs and the active devices 230 may be sufficiently dissipated into the heat exchanger 300. Thus, the cold test temperature may be accurately maintained in the cold test in spite of the operation heats of the PUTs and the active devices 230, to thereby significantly increase the accuracy of the cold test in the ATE 2000.

According to the example embodiments of the present inventive concept, the heat exchangers buried on the upper portion of the base boards may make contact with the socket boards onto which at least one PUT may be secured. Thus, a lower portion of the PUT may be set to the test temperature of the operation test by heat exchange between the socket board and the heat exchanger. An upper portion of the PUT may also be uniformly set to the test temperature of the operation test by the test fluid in the test chamber. Thus, the operation test may be conducted to the PUT under the uniform test temperature, to thereby improve the accuracy and reliability of the operation test in the ATE 2000 which may be called as an automatic test machine (ATM).

For example, since the operation heats generated from the PUTs and the active devices of the socket board may be sufficiently dissipated into the heat exchanger, the cold test temperature may be accurately maintained in the cold test in spite of the operation heats of the PUTs and the active devices, to thereby significantly increase the accuracy of the cold test in the ATM.

The foregoing is illustrative of example embodiments and is not to be construed as limiting thereof Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test apparatus for testing semiconductor packages, comprising:
    a test head having a test area;
    a socket board combined to the test area of the test head, the socket board including a socket body and an active device attached on a first surface of the socket body, the active device configured to operate a semiconductor package; and
    a heat exchanger arranged on an upper portion of the test head, the heat exchanger being in contact with the socket board,
    wherein the test head includes a head chamber, a test channel arranged in the head chamber, a base board electrically connected to the test channel,
    wherein the base board includes the test area, and
    wherein the socket board is arranged on the test area of the base board, and a plurality of base connectors arranged in the base board around the test area.

2. The test apparatus of claim 1, wherein the heat exchanger includes:
    a heat box arranged on the base board at the test area, the heat box configured to store a temperature control fluid conducting a heat exchange with the socket board;
    a reservoir arranged at an exterior of the base board, the reservoir configured to accommodate the temperature control fluid; and
    a flow line connected to the heat box and the reservoir, the flow line configured that the temperature control fluid flows between the heat box and the reservoir through the flow line.

3. The test apparatus of claim 2, wherein the heat box is disposed in a recess formed in the test area of the base board such that an upper surface of the heat box is coplanar with an upper surface of the base board.

4. The test apparatus of claim 3, wherein the heat box includes at least a receiver that is recessed from the upper surface thereof and receives the active device of the socket board such that a rear portion of the socket board makes contact with the upper surface of the heat box.

5. The test apparatus of claim 3, wherein the socket board further includes a thermal adhesive and a heat transfer plate, the thermal adhesive formed on the first surface of the socket body, the thermal adhesive covering the active device along a surface profile of the active device, the heat transfer plate contacting the thermal adhesive on a first surface of the heat transfer plate and having a flat second surface opposite to the first surface,
    wherein the heat box has a flat upper surface, and
    wherein the socket board is combined to the base board in such a configuration that the flat upper surface of the heat box makes contact with the flat second surface of the heat transfer plate.

6. The test apparatus of claim 2, wherein the flow line includes:
    a supply line connected to the heat box in the base board and configured to supply the temperature control fluid into the heat box from the reservoir;
    a discharge line connected to the heat box in the base board and configured to discharge the temperature control fluid from the heat box into the reservoir;
    a flow controller arranged on one of the supply line and the discharge line and configured to control a flux of the temperature control fluid flowing through the supply line and the discharge line; and
    a local temperature controller arranged on the supply line, and configured to individually control a temperature of the temperature control fluid in the heat box.

7. The test apparatus of claim 6, further comprising a temperature control center connected to the flow controller and the local temperature controller to control a supply flux, which is a flux of the temperature control fluid supplied into the heat box, and a discharge flux, which is a flux of the temperature control fluid discharged from the heat box, until the socket board is set to a test temperature.

8. The test apparatus of claim 1, wherein the socket board further includes a thermal adhesive and a heat transfer plate,
    wherein the thermal adhesive covers a rear portion of the socket body and the active device along a surface profile of the socket body and the active device, and
    wherein the heat transfer plate contacts the thermal adhesive on a first surface of the heat transfer plate and having a flat second surface opposite to the first surface.

9. The test apparatus of claim 8, wherein the heat exchanger includes:
- a heat body arranged at an upper portion of the base board at the test area, the heat body having a flat upper surface being in contact with the flat second surface of the heat transfer plate and configured to conduct a heat exchange with the socket board;
- a temperature control line connected to the heat body and configured to control temperature of the heat body; and
- a connector connected to the temperature control line and the heat body to selectively heat or cool down the heat body.

10. The test apparatus of claim 9, wherein the heat body includes a Peltier module and the temperature control line includes a power line for applying an electric power to the Peltier module, and
- wherein the connector includes a switch selectively switching on or off the electric power to the Peltier module at the test area of the base board such that the heat body is selectively heated by the Peltier module.

11. The test apparatus of claim 9, wherein the heat body includes a heat sink and the temperature control line includes a dissipating line configured to dissipate heat from the heat sink, and
- wherein the connector includes a heat block configured to selectively block a heat transfer between the heat sink and the dissipating line.

12. The test apparatus of claim 9, further comprising a temperature control center connected to the temperature control line and the connector, and configured to individually control a temperature of each heat body until the socket board is set to a test temperature.

13. The test apparatus of claim 1, further comprising a test chamber combined to the test head to provide a test space configured to enclose the semiconductor package and to separate the semiconductor package from surroundings such that the semiconductor package is maintained in the test space.

14. An automatic test equipment for automatically testing semiconductor packages, comprising:
- a socket board configured that a semiconductor package is secured on the socket board;
- a heat exchanger making contact with the socket board;
- a test chamber configured to provide a test space isolated from outside while the semiconductor package is tested in the test chamber; and
- a pusher arranged in the test chamber and configured to push the semiconductor packages in a test tray towards the socket board;
- a test head having a test area to which the socket board combined in such a configuration that the semiconductor package is arranged on an upper portion of the socket board; and
- an active device configured to operate the semiconductor package, the active device provided in a rear portion of the socket board,
- wherein the test head includes a head chamber, a test channel arranged in the test chamber, a base board shaped into a plate that is electrically connected to the test channel and combined to the head chamber, and
- wherein the base board is divided into a plurality of test areas and a plurality of socket boards is arranged on the plurality of test areas of the base board, respectively, and a plurality of base connectors arranged in the base board around each of the test areas.

15. The automatic test equipment of claim 14, wherein the heat exchanger includes:
- a heat box arranged at an upper portion of the base board at the test area and configured to store a temperature control fluid conducting a heat exchange with the socket board;
- a reservoir arranged at an exterior of the base board and configured to accommodate the temperature control fluid; and
- a flow line connected to the heat box and the reservoir, the flow line configured that the temperature control fluid flows between the heat box and the reservoir through the flow line.

16. The automatic test equipment of claim 15, wherein the heat box is disposed in a recess formed on an upper portion of the test area of the base board such that an upper surface of the heat box is coplanar with an upper surface of the base board,
- wherein the socket board includes a socket body, the active device disposed on a rear surface of the socket body, a thermal adhesive covering the rear surface of the socket body and the active device along a surface profile of the active device, and a heat transfer plate contacting the thermal adhesive on a first surface of the heat transfer plate and having a flat second surface opposite to the first surface,
- wherein the heat box has a flat upper surface, and
- wherein the socket board is combined to the base board in such a configuration that the flat upper surface of the heat box makes contact with the flat second surface of the heat transfer plate.

17. The automatic test equipment of claim 15, wherein the flow line includes:
- a supply line connected to the heat box in the base board and configured to supply the temperature control fluid into the heat box from the reservoir;
- a discharge line connected to the heat box in the base board and discharging the temperature control fluid from the heat box into the reservoir;
- at least a flow controller arranged on at least one of the supply line and the discharge line and configured to control a flux of the temperature control fluid flowing through the supply line and the discharge line; and
- a local temperature controller arranged on the supply line to individually control a temperature of the temperature control fluid in the heat box.

18. The automatic test equipment of claim 17, further comprising a temperature control center electrically connected to the local temperature controller and the flow controller to individually control a temperature of a heat body until the socket board is set to a test temperature.

* * * * *